(12) United States Patent
Gattobigio et al.

(10) Patent No.: US 10,095,129 B2
(45) Date of Patent: Oct. 9, 2018

(54) LITHOGRAPHIC APPARATUS AND A METHOD OF MANUFACTURING A DEVICE USING A LITHOGRAPHIC APPARATUS

(71) Applicant: ASML Netherlands B.V., Veldhoven (NL)

(72) Inventors: Giovanni Luca Gattobigio, Eindhoven (NL); Erik Henricus Egidius Catharina Eummelen, Eindhoven (NL); Ruud Olieslagers, Eindhoven (NL); Gerben Pieterse, Eindhoven (NL); Cornelius Maria Rops, Waalre (NL); Laurentius Johannes Adrianus Van Bokhoven, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/321,115

(22) PCT Filed: Jun. 1, 2015

(86) PCT No.: PCT/EP2015/062055
§ 371 (c)(1),
(2) Date: Dec. 21, 2016

(87) PCT Pub. No.: WO2016/000883
PCT Pub. Date: Jan. 7, 2016

(65) Prior Publication Data
US 2017/0131644 A1 May 11, 2017

(30) Foreign Application Priority Data
Jul. 4, 2014 (EP) ..................................... 14175743

(51) Int. Cl.
*G03F 7/20* (2006.01)

(52) U.S. Cl.
CPC .......... *G03F 7/70891* (2013.01); *G03F 7/709* (2013.01); *G03F 7/70341* (2013.01)

(58) Field of Classification Search
CPC ... G03F 7/70341; G03F 7/70891; G03F 7/709
(Continued)

(56) References Cited

U.S. PATENT DOCUMENTS

| 4,509,852 A | 4/1985 | Tabarelli et al. |
| 6,952,253 B2 | 10/2005 | Lof et al. |

(Continued)

FOREIGN PATENT DOCUMENTS

| CN | 100468200 | 3/2009 |
| EP | 1 420 298 | 5/2004 |

(Continued)

OTHER PUBLICATIONS

Taiwan Office Action dated Nov. 23, 2016 in corresponding Taiwan Patent Application No. 104119619.
(Continued)

*Primary Examiner* — Peter B Kim
(74) *Attorney, Agent, or Firm* — Pillsbury Winthrop Shaw Pittman LLP

(57) ABSTRACT

A lithographic apparatus including a projection system configured to project a patterned radiation beam onto a substrate and a fluid confinement structure configured to confine immersion fluid in a localized region between a final element of the projection system and a surface of the substrate. The lithographic apparatus is configured to have a space bounded on one side by a surface of the projection system and/or a component of the lithographic apparatus at least partially surrounding the final element of the projection system, and on the other side by a surface of the fluid confinement structure. The apparatus is configured to increase the humidity of the gas within the space.

20 Claims, 6 Drawing Sheets

(58) Field of Classification Search
USPC .......................................................... 355/30
See application file for complete search history.

(56) References Cited

U.S. PATENT DOCUMENTS

| | | | |
|---|---|---|---|
| 7,213,963 B2 | 5/2007 | Lof et al. | |
| 7,352,433 B2 | 4/2008 | Hoogendam et al. | |
| 7,411,653 B2 | 8/2008 | Hoogendam et al. | |
| 7,907,255 B2 | 3/2011 | Sengers et al. | |
| 8,027,019 B2 | 9/2011 | Kemper et al. | |
| 8,462,314 B2 | 6/2013 | Beckers et al. | |
| 8,531,648 B2 | 9/2013 | De Jager et al. | |
| 8,730,447 B2 | 5/2014 | Bruijstens et al. | |
| 8,810,771 B2 | 8/2014 | Hoogendam et al. | |
| 8,836,914 B2 | 9/2014 | Hazelton et al. | |
| 8,953,142 B2 | 2/2015 | Kemper et al. | |
| 8,976,335 B2 | 3/2015 | Beerens et al. | |
| 9,140,995 B2 | 9/2015 | Riepen | |
| 2004/0207824 A1 | 10/2004 | Lof et al. | |
| 2005/0263068 A1 | 12/2005 | Hoogendam et al. | |
| 2005/0264778 A1 | 12/2005 | Lof et al. | |
| 2007/0229786 A1 | 10/2007 | Kemper et al. | |
| 2009/0135385 A1 | 5/2009 | Gellrich et al. | |
| 2009/0059192 A1 | 6/2009 | Beckers et al. | |
| 2010/0045949 A1 | 2/2010 | Nakano et al. | |
| 2010/0045950 A1 | 2/2010 | Kemper et al. | |
| 2010/0066988 A1 | 3/2010 | Bruijstens et al. | |
| 2011/0188016 A1 | 8/2011 | De Jager et al. | |
| 2012/0062860 A1 | 3/2012 | Chonan | |
| 2012/0086926 A1 | 4/2012 | Hoogendam et al. | |
| 2012/0162621 A1 | 6/2012 | Beerens et al. | |
| 2012/0262684 A1 | 10/2012 | Hazelton et al. | |
| 2013/0100425 A1 | 4/2013 | Riepen | |
| 2016/0077447 A1* | 3/2016 | Sato | G03F 7/70866 355/30 |

FOREIGN PATENT DOCUMENTS

| | | |
|---|---|---|
| EP | 1 610 183 | 12/2005 |
| EP | 1 610 361 | 12/2005 |
| EP | 1 646 074 | 4/2006 |
| JP | 2007-201384 | 8/2007 |
| JP | 2007-528115 | 10/2007 |
| JP | 2009-158977 | 7/2009 |
| JP | 2009-158980 | 7/2009 |
| JP | 2009-302452 | 12/2009 |
| JP | 2010-074160 | 4/2010 |
| JP | 2010-205914 | 9/2010 |
| JP | 2010-263230 | 11/2010 |
| JP | 2012-064979 | 3/2012 |
| JP | 2014-107428 | 6/2014 |
| TW | 201207577 | 2/2012 |
| TW | 201229686 | 7/2012 |
| TW | 201317719 | 5/2013 |
| TW | 201413400 | 4/2014 |
| WO | WO 99/49504 | 9/1999 |
| WO | 2010/103822 | 9/2010 |
| WO | WO 2014/104139 * | 7/2014 |

OTHER PUBLICATIONS

International Search Report and Written Opinion dated Aug. 28, 2015 in corresponding International Patent Application No. PCT/EP2015/062055.

Chinese Office Action dated Oct. 9, 2017 in corresponding Chinese Patent Application No. 201580036436.9.

Japanese Office Action dated Nov. 6, 2017 in corresponding Japanese Patent Application No. 2016-573745.

Notice of Reasons for Rejection issued in corresponding Japanese Patent Application No. 2016-573745, dated Mar. 2, 2018.

* cited by examiner

LITHOGRAPHIC APPARATUS AND A METHOD OF MANUFACTURING A DEVICE USING A LITHOGRAPHIC APPARATUS

CROSS-REFERENCE TO RELATED APPLICATIONS

This application is the U.S. national phase entry of PCT patent application no. PCT/EP2015/062055, which was filed on Jun. 1, 2015, which claims the benefit of priority of European patent application no. 14175743.5, which was filed on Jul. 4 2014, and which is incorporated herein in its entirety by reference.

FIELD

The present invention relates to a lithographic apparatus and a method of manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a bather member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

Droplets of liquid may splash onto components such as the part of the final element of the projection system which is not normally in contact with immersion liquid in the immersion space. Such droplets can then evaporate forming cold spots on the components, such as the final element of the projection system, leading to imaging errors and/or focusing errors.

It is therefore desirable to provide a system to reduce the effect of splashed droplets or substantially to avoid such droplet formation.

According to an invention, there is provided a lithographic apparatus comprising:

a projection system for projecting a patterned radiation beam onto a substrate;

a fluid confinement structure configured to confine immersion fluid in a localized region between a final element of the projection system and a surface of the substrate;

a space bounded on one side by a surface of at least one of the projection system and a component of the lithographic apparatus at least partially surrounding the final element of the projection system and on the other side by a surface of the fluid confinement structure; and one or more openings on the surface of the at least one of the projection system and the component of the lithographic apparatus, configured to be connectable to one of a source of humidified gas to supply humidified gas to the space and an under-pressure source to extract gas from the space.

According to an aspect of the invention, there is provided a lithographic apparatus, comprising:

a projection system for projecting a patterned radiation beam onto a substrate; and a fluid confinement structure configured to confine immersion fluid in a localized region between a final element of the projection system and a surface of the substrate;

a space bounded on one side by a surface of at least one of the projection system and a component of the lithographic apparatus at least partially surrounding the final element of the projection system and on the other side by a surface of the fluid confinement structure; and a flexible seal extending between the fluid confinement structure and one of the surfaces of said at least one of the projection system and the component of the lithographic apparatus, the flexible seal configured such that said space is further bounded by said flexible seal.

According to an aspect of the invention, there is provided a method of manufacturing a device using a lithographic apparatus, comprising:

using a projection system to project a patterned radiation beam onto a substrate through an immersion fluid;

using a fluid confinement structure to supply and confine the immersion fluid in a localized region between a final element of the projection system and the substrate;

providing a space bounded on one side by a surface of at least one of the projection system and a component of the lithographic apparatus at least partially surrounding the final element of the projection system and on the other side by a surface of the fluid confinement structure; and at least one of supplying humidified gas to one or more openings on said surface of at least one of the projection system and the component of the lithographic apparatus bounding the space and extracting gas from one or more openings on said surface of at least one of the projection system and the component of the lithographic apparatus bounding the space.

According to an aspect of the invention, there is provided a method of manufacturing a device using a lithographic apparatus, comprising:

using a projection system to project a patterned radiation beam onto a substrate through an immersion fluid;

using a fluid confinement structure to supply and confine the immersion fluid in a localized region between a final element of the projection system and the substrate;

providing a space bounded on one side by a surface of at least one of the projection system and a component of the lithographic apparatus at least partially surrounding the final element of the projection system and on the other side by a surface of the fluid confinement structure;

wherein the space is further bounded by a flexible seal extending between the fluid confinement structure and one of the surfaces of said at least one of the projection system and the component of the lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
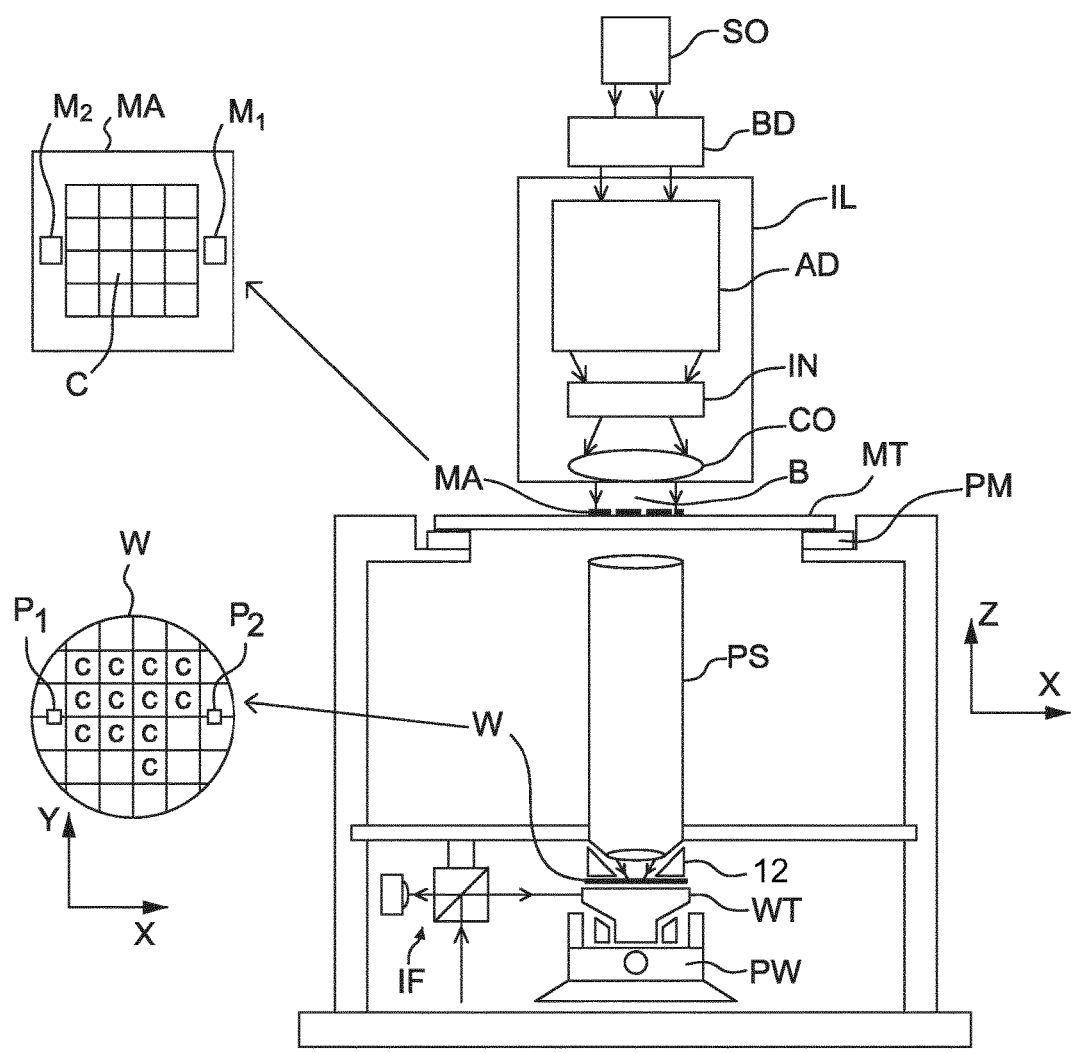
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate table WT constructed to hold a substrate (e.g. a resist-coated substrate) W, connected to a second positioner PW configured to accurately position the surface of the table, for example a substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof as appropriate for the exposure radiation being used, or for other factors such as the use of an immersion liquid or the use of a vacuum. Any use of the term "projection lens" herein may be considered as synonymous with the more general term "projection system". The term "lens", where the context allows, may refer to any one or combination of various types of optical components, including refractive and reflective optical components.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more substrate tables or a combination of one or more substrate tables and one or more cleaning, sensor or measurement tables. For example, in an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In such "multiple stage" (or "multi-stage") machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, cleaning, sensor and/or measurement tables.

In an embodiment, the lithographic apparatus may comprise an encoder system to measure the position, velocity, etc. of a component of the apparatus. In an embodiment, the component comprises a substrate table. In an embodiment, the component comprises a measurement and/or sensor and/or cleaning table. The encoder system may be in addition to or an alternative to the interferometer system described herein for the tables. The encoder system comprises a sensor, transducer or read-head associated, e.g., paired, with a scale or grid. In an embodiment, the movable component (e.g., the substrate table and/or the measurement and/or sensor and/or cleaning table) has one or more scales or grids and a frame of the lithographic apparatus with respect to which the component moves has one or more of sensors, transducers or read-heads. The one or more of sensors, transducers or read-heads cooperate with the scale (s) or grid(s) to determine the position, velocity, etc. of the component. In an embodiment, a frame of the lithographic apparatus with respect to which a component moves has one or more scales or grids and the movable component (e.g., the substrate table and/or the measurement and/or sensor and/or cleaning table) has one or more of sensors, transducers or read-heads that cooperate with the scale(s) or grid(s) to determine the position, velocity, etc. of the component.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
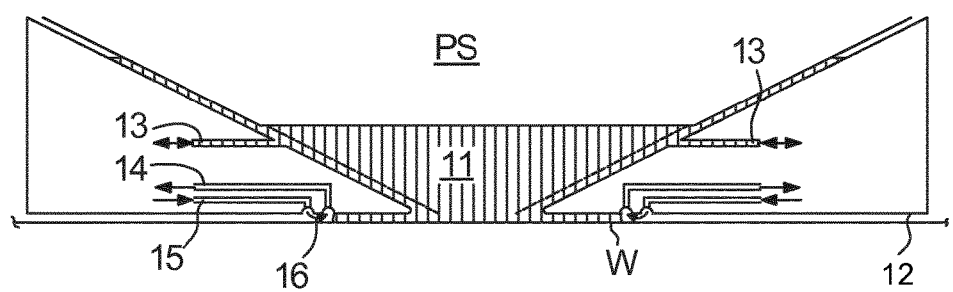
FIG. 2 depicts a liquid supply system for use in a lithographic projection apparatus.
Figure 3:
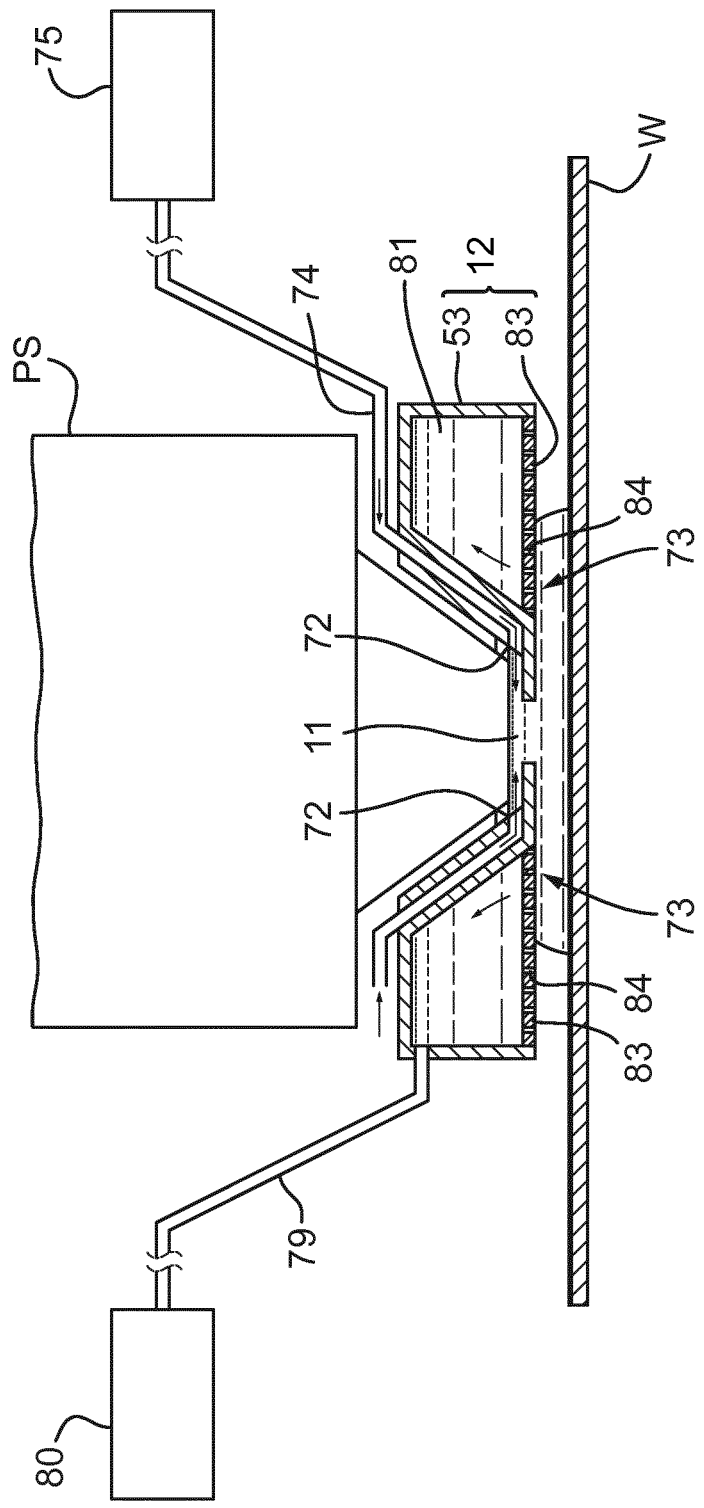
FIG. 3 is a side cross sectional view that depicts a further liquid supply system according to an embodiment.

A localized immersion system may be used to provide liquid between a final element of the projection system PS and the substrate W. A localized immersion system uses a liquid supply system or fluid confinement structure in which liquid is only provided to a localized area of the substrate. The area filled by liquid is smaller in plan than the top surface of the substrate and the area filled with liquid remains substantially stationary relative to the projection system PS while the substrate W moves underneath that area. FIGS. 2 and 3 show different liquid supply systems which can be used in such a system. A sealing feature is present to seal liquid to the localized area. One way which has been proposed to arrange for this is disclosed in PCT patent application publication no. WO 99/49504.

An all wet arrangement may be used to provide liquid between a final element of the projection system PS and the substrate W. In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply systems of FIGS. 2 and 3 can also be used in such a system. However, a sealing feature is not present, not activated, not as efficient as normal or otherwise ineffective to seal liquid to only the localized area.

In an embodiment, the lithographic apparatus comprises a fluid confinement structure that has a liquid removal device having an inlet covered with a mesh or similar porous material. The mesh or similar porous material provides a two-dimensional array of holes contacting the immersion liquid in a space between the final element of the projection system and a movable table (e.g., the substrate table). In an embodiment, the mesh or similar porous material comprises a honeycomb or other polygonal mesh. In an embodiment, the mesh or similar porous material comprises a metal mesh. In an embodiment, the mesh or similar porous material extends all the way around the image field of the projection system of the lithographic apparatus. In an embodiment, the mesh or similar porous material is located on a bottom surface of the fluid confinement structure and has a surface facing towards the table. In an embodiment, the mesh or similar porous material has at least a portion of its bottom surface generally parallel with a top surface of the table.

FIG. 2 schematically depicts a localized liquid supply system or fluid confinement structure 12 which extends along at least a part of a boundary of the region between the final element of the projection system and the substrate table WT or substrate W. (Please note that reference in the following text to surface of the substrate W also refers in addition or in the alternative to a surface of the substrate table WT, unless expressly stated otherwise.) The fluid confinement structure 12 is substantially stationary relative to the projection system PS in the XY plane though there may be some relative movement in the Z direction (in the direction of the optical axis). In an embodiment, a seal is formed between the fluid confinement structure 12 and the surface of the substrate W and may be a contactless seal such as a gas seal (such a system with a gas seal is disclosed in European patent application publication no. EP-A-1,420, 298) or liquid seal.

The fluid confinement structure 12 at least partly contains liquid in the region 11 between a final element of the projection system PS and the substrate W. A contactless seal 16 to the substrate W may be formed around the image field of the projection system PS so that liquid is confined within the region between the substrate W surface and the final element of the projection system PS. The region 11 is at least partly formed by the fluid confinement structure 12 positioned below and surrounding the final element of the projection system PS. Liquid is brought into the region below the projection system PS and within the fluid confinement structure 12 by liquid inlet 13. The liquid may be removed by liquid outlet 13. The fluid confinement structure 12 may extend a little above the final element of the projection system PS. The liquid level rises above the final element so that a buffer of liquid is provided. In an embodiment, the fluid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid may be contained in the region 11 by a gas seal 16 which, during use, is formed between the bottom of the fluid confinement structure 12 and the surface of the substrate W. The gas seal is formed by gas. The gas in the gas seal is provided under pressure via inlet 15 to the gap between the fluid confinement structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid confinement structure 12 and the substrate W contains the liquid in region 11. The inlets/outlets may be annular grooves which surround the region 11. The annular grooves may be continuous or discontinuous. The flow of gas 16 is effective to contain the liquid in the region 11. Such a system is disclosed in United States patent application publication no. US 2004-0207824. In an embodiment, the fluid confinement structure 12 does not have a gas seal.

FIG. 3 is a side cross sectional view that depicts a further a localized liquid supply system or fluid confinement structure 12 according to an embodiment. The arrangement illustrated in FIG. 3 and described below may be applied to the lithographic apparatus described above and illustrated in FIG. 1. The liquid supply system is provided with a fluid confinement structure 12, which extends along at least a part of a boundary of the space between the final element of the projection system PS and the substrate table WT or substrate W. (Please note that reference in the following text to surface of the substrate W also refers in addition or in the alternative to a surface of the substrate table WT, unless expressly stated otherwise.)

The fluid confinement structure 12 at least partly contains liquid in the localized region 11 between the final element of the projection system PS and the substrate W. The localized region 11 is at least partly formed by the fluid confinement structure 12 positioned below and surrounding the final element of the projection system PS. In an embodiment, the fluid confinement structure 12 comprises a main body member 53 and a porous member 83. The porous member 83 is plate shaped and has a plurality of holes (i.e., openings or pores). In an embodiment, the porous member 83 is a mesh plate wherein numerous small holes 84 are formed in a mesh. Such a system is disclosed in United States patent application publication no. US 2010/0045949 A1, which is hereby incorporated by reference in its entirety.

The main body member 53 comprises supply ports 72, which are capable of supplying the liquid to the localized region 11, and a recovery port 73, which is capable of recovering the liquid from the localized region 11. The supply ports 72 are connected to a liquid supply apparatus 75 via passageways 74. The liquid supply apparatus 75 is capable of supplying the liquid to the supply ports 72. The liquid that is fed from the liquid supply apparatus 75 is supplied to each of the supply ports 72 through the corresponding passageway 74. The supply ports 72 are disposed in the vicinity of the optical path at prescribed positions of the main body member 53 that face the optical path. The recovery port 73 is capable of recovering the liquid from the localized region 11. The recovery port 73 is connected to a liquid recovery apparatus 80 via a passageway 79. The liquid recovery apparatus 80 comprises a vacuum system and is capable of recovering the liquid by suctioning it via the recovery port 73. The liquid recovery apparatus 80 recovers the liquid recovered via the recovery port 7323 through the passageway 79. The porous member 83 is disposed in the recovery port 73.

In an embodiment, to form the localized region 11 with the liquid between the projection system PS and the fluid confinement structure 12 on one side and the substrate W on the other side, liquid is supplied from the supply ports 72 to the localized region 11 and the pressure in a recovery chamber 81 in the fluid confinement structure 12 is adjusted to a negative pressure so as to recover the liquid via the holes 84 (i.e., the recovery port 73) of the porous member 83. Performing the liquid supply operation using the supply ports 72 and the liquid recovery operation using the porous member 83 forms the localized region 11 between the projection system PS and the fluid confinement structure 12 on one side and the substrate W on the other side.

Figure 4:
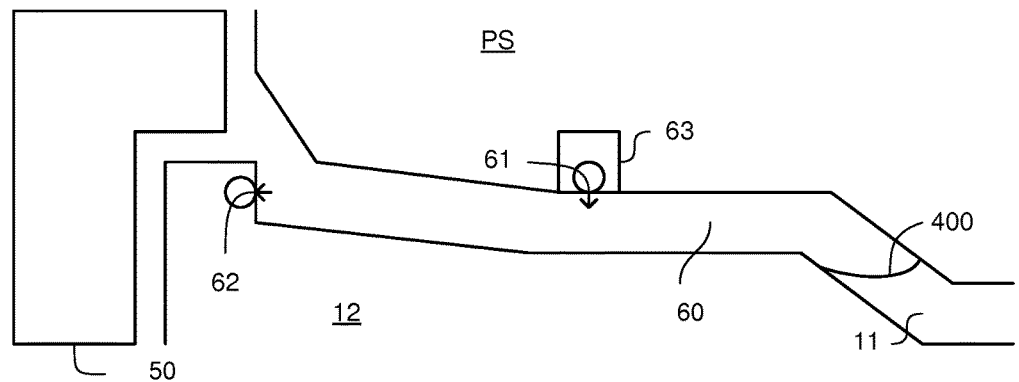
FIG. 4 depicts, in cross-section, a fluid confinement structure and projection system in accordance with a further embodiment of the invention.

As noted above, droplets of immersion fluid may be splashed onto or formed on the surface of the final element of the projection system PS. This may occur adjacent to the localized region 11 in which the immersion fluid is confined. This may occur when the meniscus 400 is caused to move, for example due to movement of the substrate W and/or the substrate table WT relative to the projection system PS. In an embodiment of the invention, a supply of humidified gas is provided to a space 60 adjacent the immersion fluid in the localized region 11. The humidified gas may contain the immersion fluid in a gaseous form. This may reduce the evaporation of the droplets of immersion fluid. As shown in FIG. 4, the space 60 may be bounded on one side by a surface of the projection system PS and on the other side by a surface of the fluid confinement structure 12. The space 60 is provided adjacent to the localized region 11 containing the immersion fluid. Therefore, the space 60 may also be partly bounded by a surface of the immersion fluid in the localized region 11, for example by the meniscus 400.

Optionally, as shown in FIG. 4, a component may be included that surrounds at least the final element of the projection system PS. For example, a thermal conditioning system 50 may be provided. The thermal conditioning system 50 may be configured to thermally condition at least the final element of the projection system PS. Such a thermal conditioning system 50 may, for example, be arranged around at least the final element of the projection system PS and in close proximity to it. A component surrounding at least the final element of the projection system PS may have an alternative or additional function to the example of a thermal conditioning system 50 discussed in more detail below. For example, a component surrounding at least the final element of the projection system PS may be a metrology frame.

It should be appreciated that in the Figures, the separation between the projection system PS and the thermal conditioning system 50 is shown in exaggerated form for clarity. In addition, in some arrangements there may not be a separation between the projection system PS and the thermal conditioning system 50 or other component surrounding at least the final element of the projection system PS.

The thermal conditioning system 50 may be configured to minimize temperature fluctuations of the projection system PS relative a desired operating temperature. This may be achieved, for example, by the thermal conditioning system 50 having a relatively high heat capacity. For example, it may be formed from a relatively large mass of a material such as a metal. Alternatively or additionally, the thermal conditioning system 50 may have a plurality of channels within it. A thermal conditioning fluid may be provided within those channels. In particular, the thermal conditioning fluid may be circulated via a conditioning system that maintains a stable temperature of the thermal conditioning fluid. Alternatively or additionally one or more Peltier devices and/or heaters may be provided in the thermal conditioning system 50.

Although the component is described in the context of the use of a thermal conditioning system 50, it should be appreciated that the component may be provided for other reasons and/or have a different configuration. In either case, it should be appreciated that the component 50 need not have the shape in cross-section depicted in FIGS. 4 to 8.

In the event that a component such as thermal conditioning system 50 is used, the combination of at least one surface of the projection system and at least one surface of the thermal conditioning system 50 together may bound one side of the space 60. Such an arrangement is depicted in FIG. 4.

By maintaining the immersion fluid humidity within the space 60, evaporation of immersion fluid from droplets on the surface of the projection system PS and, in particular the final element of the projection system PS, may be minimized. Accordingly, one or more openings 61 are provided that are connectable to a source of humidified gas via a suitable conduit (not depicted in the drawing). Accordingly, humidified gas may be provided to the space 60. The source of humidified gas may be used to maintain the humidity level within the space 60.

One or more openings 62 may also be provided to extract gas from the space 60. For example, the one or more openings 62 may be connectable via a conduit to an under-pressure source. The one or more openings 62 may be appropriately located to minimize the leakage of humidified gas to other parts of the lithographic apparatus.

In an arrangement of the present invention, at least one of the one or more openings 61 connectable to the source of humidified gas and the one or more openings 62 connected to the under-pressure source may be arranged on a surface on the opposite side of the space 60 from the fluid confinement structure 12. For example, the one or more openings 61, 62 may be provided on the surface of the projection system PS, as shown in FIG. 4. In other arrangements, as discussed below, at least one of the openings 61, 62 may be provided on the surface of the thermal conditioning system 50, if provided.

Alternatively or additionally, if another component is provided that at least partially surrounds the final element of the projection system PS, at least one of the openings 61, 62 may be provided in a surface of that component.

Providing at least one of the openings 61, 62 on a surface on the opposite side of the space 60 from the fluid confinement structure 12 may reduce the requirement to fit additional services within the fluid confinement structure 12. A plurality of services may already be provided within the fluid confinement structure 12 in order to control the provision of the immersion fluid within the localized region 11. Providing additional services within the fluid confinement structure 12, such as those to provide humidified gas to the space 60, may be difficult and/or affect the provision of existing services.

In the arrangement depicted in FIG. 4, the one or more openings 61 connectable to the source of humidified gas are provided on the surface of the projection system PS that bounds the space 60. The one or more openings 62 that are connectable to the under-pressure source to extract gas from the space 60 are provided on the surface of the fluid confinement structure 12.

It should be appreciated that the arrangement may be switched around. In that case, the one or more openings 61 on the surface of the projection system PS may be connectable to the under-pressure source and the one or more openings 62 on the fluid confinement structure 12 may be connectable to the source of humidified gas.

Figure 5:
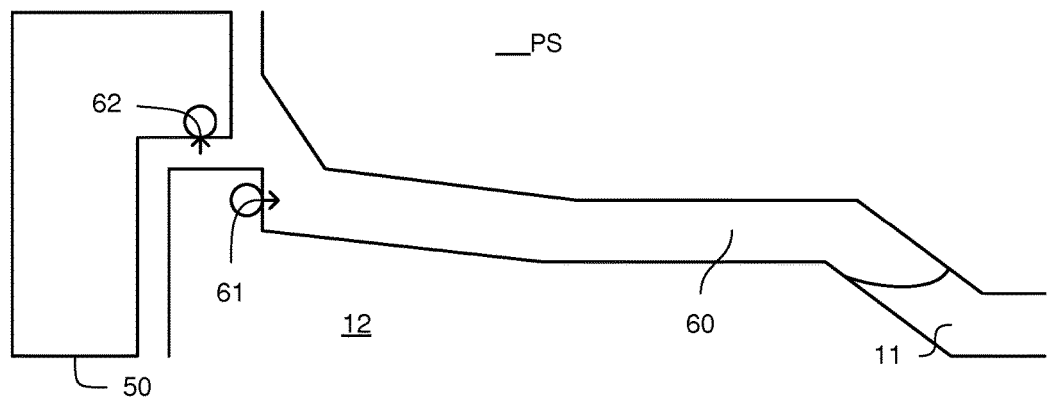
FIG. 5 depicts, in cross-section, a fluid confinement structure and projection system in accordance with a further embodiment of the invention.

FIG. 5 depicts a variant of such an arrangement. In the arrangement of FIG. 5, instead of providing the one or more openings 62 connectable to an under-pressure source on the surface of the projection system PS, the one or more openings 62 connectable to an under-pressure source are provided on a surface of the thermal conditioning system 50. Such an arrangement may ensure that at least one of the one or more openings 61, 62 connectable to the source of humidified gas or the under-pressure source need not be accommodated within the fluid confinement structure 12. However, such an arrangement also avoids the requirement to provide a set of one or more openings 61, 62 within the projection system PS. Similarly, a conduit is not required in the projection system PS to connect the one or more openings 61, 62 to a source of humidified gas or an under-pressure source. The provision of such openings 61, 62 and associated gas flow in a conduit may cause vibrations within the projection system PS. By not requiring the openings 61, 62 and/or an associated conduit in the projection system PS, vibration induced errors in the projection system PS may be reduced.

In an arrangement of the present invention, the one or more openings 62 connectable to an under-pressure source may be arranged further from the localized region 11 containing the immersion fluid than the one or more openings 61 connectable to the source of humidified gas. Such an arrangement may assist in the control of leakage of the humidified gas to other parts of the lithographic apparatus.

It will be appreciated that the one or more openings 62 connectable to the under-pressure source must be sufficiently separated from the one or more openings 61 connectable to the source of humidified gas to ensure that humidified gas is provided to the space 60 rather than immediately extracted. However, the greater the separation between the one or more openings 61 connectable to the source of humidified gas and the one or more openings 62 connectable to the under-pressure source, the greater the amount of extraction that will be required in order to minimize the leakage of the humidified gas to other parts of the lithographic apparatus. Therefore, the separation between the one or more openings 61 connectable to the source of humidified gas and the one or more openings 62 connectable to the under-pressure source may be chosen to balance these requirements.

In general, it may be expected that the level of immersion fluid humidity within the space 60 may decrease from the location of the one or more openings 61 connectable to the source of humidified gas in the space 60 to the location of the one or more openings 62 connectable to the under-pressure source. Therefore, the highest humidity in the space 60 may be found close to the location of the one or more openings 61 connectable to the source of humidified gas. Accordingly, at least the one or more openings 61 connectable to the source of the humidified gas may be located as close as possible to the localized region 11 containing the immersion fluid. This location is the location at which there is most likely to be droplets of immersion fluid formed on the surface of the projection system PS. Providing the one or more openings 61 connectable to the source of humidified gas at this location may ensure that the highest possible humidity is provided at the location at which it is most useful to suppress evaporation.

Therefore, the one or more openings 61 connectable to the source of humidified gas may be provided on a surface of the projection system PS. The above-described benefit of this arrangement may be greater than the possible disadvantage of a risk of vibrations being generated within the projection system PS caused by the inclusion of one or more openings 61 and the associated conduit within the projection system PS.

If a set of one or more openings 61, 62 and an associated conduit are provided within the projection system PS the conduit and/or openings 61, 62 may be mounted to the projection system PS by means of a vibration isolation system 63. Such an arrangement is shown in FIG. 4, in which one or more openings 61 connectable to a source of humidified gas are provided on a surface of the projection system PS. In particular, the gas conduit and the portion of the surface of the projection system PS within which the one or more openings 61 are formed may be separated from the remainder of the projection system PS by way of resilient members and/or dampers that form a vibration isolation system 63. Such an arrangement may minimize the transfer of vibrations between the gas conduit and openings 61 connectable to a source of humidified gas on the one hand and the projection system PS on the other hand. Accordingly gas-flow induced vibrations may not significantly affect the operation of the projection system PS.

Figure 6:
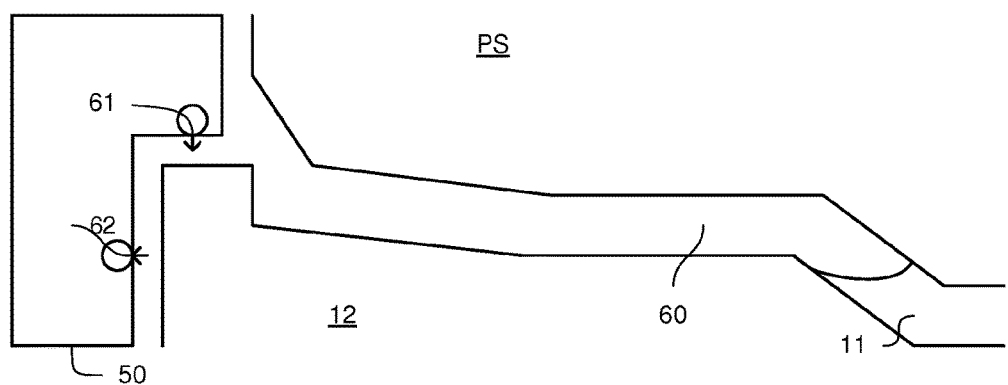
FIG. 6 depicts, in cross-section, a fluid confinement structure and projection system in accordance with a further embodiment of the invention.
Figure 7:
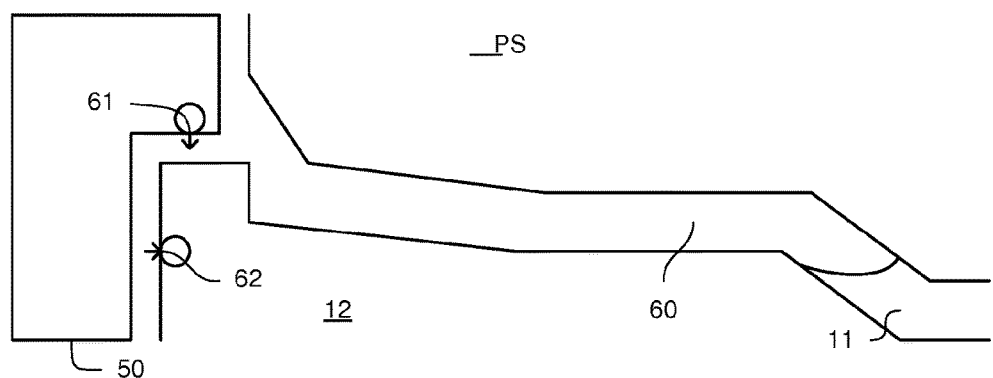
FIG. 7 depicts, in cross-section, a fluid confinement structure and projection system in accordance with a further embodiment of the invention.

FIGS. 6 and 7 depict arrangements in which the lithographic apparatus includes a component such as a thermal conditioning system 50 that at least partially surrounds the final element of the projection system PS. As shown in FIGS. 6 and 7, the thermal conditioning system 50 may be configured such that it also at least partially surrounds the part of the fluid confinement structure 12. In that case, the one or more openings 61 connectable to the source of humidified gas may be formed on a surface of the thermal conditioning system 50 that bounds the space 60. The one or more openings 62 may then be arranged at a location further away from the localized region 11 containing the immersion fluid. In particular the openings 62 may be formed at a location where a surface of the component faces an opposing surface of the fluid confinement system 12.

In one arrangement shown in FIG. 6, the one or more openings 62 connectable to the under-pressure source may also be provided on the thermal conditioning system 50. As shown in FIG. 7, in another arrangement the one or more openings 62 connectable to the under-pressure source may be provided on a surface of the fluid confinement structure 12.

In arrangements such as those depicted in FIGS. 4 and 7, in which the one or more openings 62 connectable to the under-pressure source are provided on a surface of the fluid confinement structure 12, the one or more openings 62 connectable to the under-pressure source may connect to a conduit that is part of the system of the fluid confinement structure 12 to confine the immersion fluid. Accordingly, a common under-pressure source and/or conduit connectable to an under-pressure source may be used for both the system to confine the fluid and for extraction of the humidified gas from the space 60.

It should be appreciated that other arrangements and combinations of arrangements of the openings 61, 62 may be provided other than the examples depicted in FIGS. 4 to 7.

The source of humidified gas may be configured to supply gas that has the maximum attainable humidity at the temperature and pressure of the gas supply. However, any subsequent drop in pressure during the delivery of the gas from the humidified gas source to the space 60 will result in a reduction from the maximum attainable humidity of the gas for the resultant gas pressure. This may reduce the effect of suppressing the evaporation of immersion fluid within the space 60.

Accordingly, the system for delivering the humidified gas from the source of humidified gas source to the space 60 may be configured to minimize the pressure drop. For example, the gas conduit between the source of humidified gas and the one or more openings 61 into the space 60 may be configured to be smooth and/or have no sharp corners.

Alternatively or additionally, multiple conduits may be used between the source of humidified gas and the one or more openings 61. In addition, the one or more gas conduits may have a relatively large diameter, for example 3-8 mm, optionally 4-6 mm. Larger diameter conduits may also be used.

The pressure drop may also be minimized by arranging the one or more openings 61 to be sufficiently large. For example, the one or more openings 61 may have a cross-section of approximately 0.2-2 mm, optionally 0.5-1 mm. In general, a plurality of openings 61 may be used to supply the humidified gas into the space 60. For example, an arrangement to 10-100 holes may be arranged along a line around the localized region 11 containing the immersion fluid. In an arrangement, the openings 61 may be sufficiently close to each other that the flow of humidified gas from the openings 61 forms a curtain of humidified gas. The openings 61 may be set apart from adjacent openings by from a few millimeters to a few centimeters.

The arrangement of the openings 61 may be not be the same all of the way round the localized region 11 containing the immersion fluid. For example, the size of the openings 61 may be different in a first region compared to a second region. Alternatively or additionally, the separation between adjacent openings 61 may be different in a first region from a second region.

The effect of the asymmetry of the arrangement of the openings 61 may be such that a greater flow of humidified gas may be provided in one region compared to another region. This may be the case, even though all of the openings 61 may be connected to the same source of humidified gas.

Such an arrangement may be useful if there are asymmetries in the arrangement of the fluid confinement structure 12. In particular, the fluid confinement structure 12 is configured to extract immersion fluid and gas, which may also contain particles of immersion fluid. This extraction may also extract some of the humidified gas provided to the space 60.

When a substrate W and/or substrate table WT is moved relative to the fluid confinement structure 12, the extraction of immersion fluid and gas by the fluid confinement structure 12 may be configured to be greater on one side of the fluid confinement structure 12 than the other to take into account the movement of the substrate and/or substrate table WT relative to the fluid confinement structure 12. This may result in a correspondingly greater extraction of the humidified gas provided to the space 60 by the fluid confinement structure 12 on one side than the other. Accordingly, having a relatively higher flow of humidified gas provided to the space 60 on such a side of the fluid confinement structure 12 may offset the effect of the additional extraction of humidified gas on that side by the fluid confinement structure 12.

This may ensure that the humidity levels within the space 60 are as consistent as possible on all sides of the localized region 11 containing the immersion fluid.

In general, the considerations for the arrangement of the one or more openings 62 connectable to the under-pressure source may be the same as those discussed above in relation to the one or more openings 61 connectable to the source of humidified gas.

In an arrangement, the one or more openings 61, 62 connectable to the source of humidified gas and/or the under-pressure source may be provided in the form of a porous membrane. However, the provision of a porous membrane may result in a relatively large pressure drop. Accordingly, to the porous membrane may only be used in conjunction with the one or more openings 62 connectable to the under-pressure source. As explained below, the provision of a relatively large pressure drop may be beneficial in the extraction flow path.

The one or more openings 62 connectable to the under-pressure source may have a gas flow restriction associated with it (not depicted in the drawings). For example as discussed above, a porous membrane may be provided at the one or more openings 62. This will provide a gas flow restriction. Alternatively or additionally, a constriction may be provided within the conduit connecting the one or more openings 62 to the under-pressure source. The constriction may, for example, be a narrowing of the conduit or one or more changes of direction of the conduit. Either such arrangement of a gas flow restriction, or another form of gas flow restriction may be used to create a pressure drop. A relatively large pressure drop in the extraction flow path may reduce the effects of fluctuations in the pressure.

In an arrangement, a gas flow restriction may not be associated with the one or more openings 62 connectable to the under-pressure source. The one or more openings 62 connectable to the under-pressure source and one or more conduits connecting the one or more openings 62 to the under-pressure source may be configured to minimize the pressure drop between the one or more openings 62 and the under-pressure source. This may be attained by use of similar configurations to those discussed above in relation to the one or more openings 61 connectable to the source of humidified gas.

It should be appreciated that the source of humidified gas may supply any suitable gas that is humidified with the immersion fluid. In the case of using ultra pure water as the immersion fluid, it may be convenient to use humidified air as the humidified gas.

It should be appreciated that in order to maintain the humidity level within the space 60, the leakage of the humidified gas from the space 60 may be minimized. Accordingly, the lithographic apparatus may be configured to minimize the size of the gaps between, for example, the projection system PS and the fluid confinement structure 12. Alternatively or additionally, the gap between the projection system PS and any component such as the thermal conditioning system 50 surrounding the final element of the projection system PS may be minimized. Alternatively or additionally, the gap between the fluid confinement structure 12 and a component such as the thermal conditioning system 50 that surrounds the final element of the projection system PS may be minimized. However, it should be appreciated that a minimum separation between such parts of the lithographic apparatus may be required in order to provide movement of the parts relative to each other without contact between the parts of the lithographic apparatus during use of the lithographic apparatus.

Figure 8:
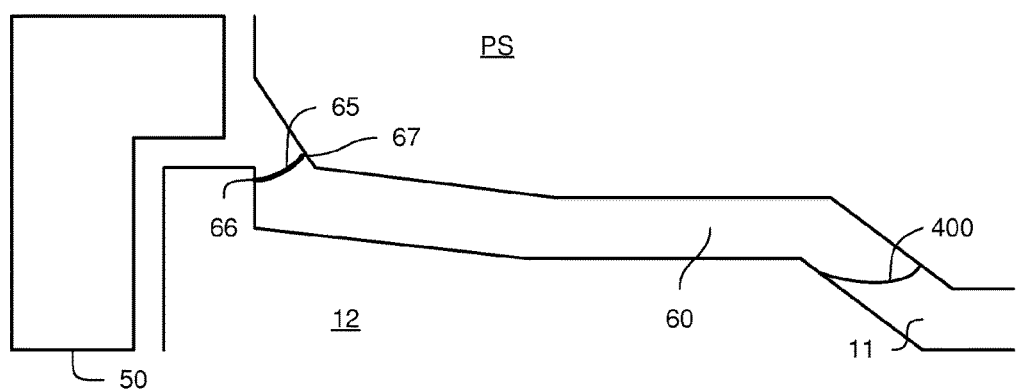
FIG. 8 depicts, in cross-section, a fluid confinement structure and projection system in accordance with a further embodiment of the invention.

FIG. 8 depicts an embodiment of the invention that may be used on its own or in conjunction with any of the embodiments discussed above. As shown, a flexible seal 65 may be provided that extends across a gap between two parts of the lithographic apparatus in order to provide a boundary to the space 60. In the arrangement depicted in FIG. 8, the flexible seal 65 extends from a surface of the fluid confinement structure 12 to a surface of the projection system PS. The arrangement of the flexible seal 65 may help contain the humidified gas within the space 60. In an embodiment that does not include provision of humidified gas from a source of humidified gas, the gas in the space 60 may be humidified by evaporation of the immersion fluid at the meniscus 400 at the edge of the localized region 11 containing the immersion fluid.

In an arrangement, the flexible seal 65 may be configured such that, when the volume of the space 60 remains constant, gas does not flow pass the flexible seal 65. However, when the volume of the space 60 changes, gas may flow past the flexible seal 65. This may avoid the change of volume of the space 60 causing changes of pressure within the space 60. The volume of the space 60 may change, for example, when the fluid confinement structure 12 moves relative to the projection system PS. This may occur during use of the lithographic apparatus.

A first edge 66 of the flexible seal 65 may be configured to be attached to a part of the lithographic apparatus. A second edge 67 of the flexible seal 65 may merely abut another part of the lithographic apparatus at the other end. For example, in the arrangement depicted in FIG. 8, the flexible seal 65 is fixedly connected to the fluid confinement system 12 at the first edge 66 of the flexible seal 65. The second edge 67 of the flexible seal 65 merely abuts the projection system PS. Accordingly, if there is any slight increase in pressure within the space 60, the flexible seal 65 may flex creating a small space for gas to flow between the second edge 67 of the flexible seal 65 and the projection system PS.

In addition, the use of a flexible seal 65 may minimize the transfer of any vibrations from one component to another. For example, for an arrangement such as that depicted in FIG. 8, this may minimize the transfer of any vibrations from the fluid confinement structure 12 to the projection system PS.

The flexible seal 65 may be formed from any material that is suitable for use within a lithographic apparatus and has the required elastic properties. It may be desirable for the flexible seal 65 to be able to deform elastically a small amount to permit the flexing discussed above. Alternatively or additionally, the flexible seal 65 may be configured such that, when the second edge 67 of the flexible seal 65 abuts the projection system PS, it is elastically deformed a small amount such that it is biased to abut the projection system PS. The flexible seal 65 may be formed from a metal or from a plastic. For example, the flexible seal 65 may be formed from Polytetrafluoroethylene (PTFE).

In conjunction with any of the embodiments discussed above, an evaporator may be provided that heats the immersion fluid within the fluid confinement structure 12 and provides immersion fluid vapor to the space 60. This may assist in maximizing the humidity within the space 60.

In an embodiment, there is provided a lithographic apparatus comprising: a projection system for projecting a patterned radiation beam onto a substrate; a fluid confinement structure configured to confine immersion fluid in a localized region between a final element of the projection system and a surface of the substrate; a space bounded on one side by a surface of at least one of the projection system and a component of the lithographic apparatus at least partially surrounding the final element of the projection system and on the other side by a surface of the fluid confinement structure; and one or more openings on the surface of the at least one of the projection system and the component of the lithographic apparatus, configured to be connectable to one of a source of humidified gas to supply humidified gas to the space and an under-pressure source to extract gas from the space.

In an embodiment, the one or more openings are provided on a surface of the projection system. In an embodiment, the one or more openings are formed in a gas supply conduit that is mounted to the projection system by a vibration isolation system. In an embodiment, the component comprises a thermal conditioning system configured to minimise variations of temperature of at least the final element of the projection system; and the one or more openings are formed in a surface of the thermal conditioning system. In an embodiment, the at least one component comprises a thermal conditioning system configured to minimize variations of temperature of at least the final element of the projection system; a part of the thermal conditioning system surrounds a part of the fluid confinement structure such that a gap is provided between the surface of the thermal conditioning system and the surface of the fluid confinement structure that face each other; and the one or more openings are provided on one of the facing surfaces of the thermal conditioning system and the fluid confinement structure and are configured to be connectable to the under-pressure source to extract gas from the space. In an embodiment, the lithographic apparatus further comprises one or more openings configured to be connectable to the other of the source of humidified gas to supply humidified gas to the space and the under-pressure source to extract gas from the space; wherein the one or more openings configured to be connectable to the source of humidified gas to supply humidified gas to the space are closer to the immersion fluid in the localized region than the one or more openings configured to be connectable to the under-pressure source to extract gas from the space. In an embodiment, said one or more openings comprise a plurality of openings provided along a line that at least partially surrounds the space; and at least one of the cross section of the openings and the separation between adjacent openings is different for a first group of said openings than for a second group of said openings. In an embodiment, at least one opening is associated with a gas flow restriction. In an embodiment, the lithographic apparatus comprises a flexible seal extending between the fluid confinement structure and one of the surfaces of said at least one of the projection system and the component of the lithographic apparatus, the flexible seal configured such that said space is further bounded by said flexible seal.

In an embodiment, there is provided a lithographic apparatus, comprising: a projection system for projecting a patterned radiation beam onto a substrate; and a fluid confinement structure configured to confine immersion fluid in a localized region between a final element of the projection system and a surface of the substrate; a space bounded on one side by a surface of at least one of the projection system and a component of the lithographic apparatus at least partially surrounding the final element of the projection system and on the other side by a surface of the fluid confinement structure; and a flexible seal extending between the fluid confinement structure and one of the surfaces of said at least one of the projection system and the component of the lithographic apparatus, the flexible seal configured such that said space is further bounded by said flexible seal.

In an embodiment, the flexible seal is configured to minimise the flow of gas past the flexible seal when the volume of said space is constant but to permit gas flow past the seal when the volume of said space changes. In an embodiment, the flexible seal is connected at a first edge of the flexible seal to a surface of the fluid confinement structure or the surface of the at least one of the projection system and the component of the lithographic apparatus and configured such that a second edge of the flexible seal abuts the other of the surface of the fluid confinement structure or the surface the at least one of the projection system and the component of the lithographic apparatus.

In an embodiment, there is provided a method of manufacturing a device using a lithographic apparatus, comprising: using a projection system to project a patterned radiation beam onto a substrate through an immersion fluid; using a fluid confinement structure to supply and confine the immersion fluid in a localized region between a final element of the projection system and the substrate; providing a space bounded on one side by a surface of at least one of the projection system and a component of the lithographic apparatus at least partially surrounding the final element of the projection system and on the other side by a surface of the fluid confinement structure; and at least one of supplying humidified gas to one or more openings on said surface of at least one of the projection system and the component of the lithographic apparatus bounding the space and extracting gas from one or more openings on said surface of at least one of the projection system and the component of the lithographic apparatus bounding the space.

In an embodiment, there is provided a method of manufacturing a device using a lithographic apparatus, comprising: using a projection system to project a patterned radiation beam onto a substrate through an immersion fluid; using a fluid confinement structure to supply and confine the immersion fluid in a localized region between a final element of the projection system and the substrate; providing a space bounded on one side by a surface of at least one of the projection system and a component of the lithographic apparatus at least partially surrounding the final element of the projection system and on the other side by a surface of the fluid confinement structure; wherein the space is further bounded by a flexible seal extending between the fluid confinement structure and one of the surfaces of said at least one of the projection system and the component of the lithographic apparatus.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers. The terms "radiation" and "beam" used herein encompass all types of electromagnetic radiation, including ultraviolet (UV) radiation (e.g. having a wavelength of or about 365, 248, 193, 157 or 126 nm).

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a projection system configured to project a patterned radiation beam onto a substrate;
   a fluid confinement structure configured to confine immersion fluid in a localized region between a final element of the projection system and a surface of the substrate;
   a space bounded on one side by a surface of the projection system and/or of a component of the lithographic apparatus at least partially surrounding the final element of the projection system, the component separated from the fluid confinement structure, and on the other side by a surface of the fluid confinement structure;
   one or more openings in the surface of the projection system and/or of the component of the lithographic apparatus, configured to be connectable to either a source of humidified gas to supply humidified gas to the space or an under-pressure source to extract gas from the space; and
   one or more openings configured to be connectable to the other of the source of humidified gas to supply humidified gas to the space and the under-pressure source to extract gas from the space, wherein the one or more openings configured to be connectable to the source of humidified gas to supply humidified gas to the space are closer to the immersion fluid in the localized region than the one or more openings configured to be connectable to the under-pressure source to extract gas from the space.

2. The lithographic apparatus as claimed in claim 1, wherein the one or more openings in the surface are provided in the surface of the projection system.

3. The lithographic apparatus as claimed in claim 2, wherein the one or more openings in the surface are formed in a gas supply conduit that is mounted to the projection system by a vibration isolation system.

4. The lithographic apparatus as claimed in claim 1, comprising the component and wherein the component comprises a thermal conditioning system configured to reduce variations of temperature of at least the final element of the projection system; and
   wherein the one or more openings in the surface are formed in a surface of the thermal conditioning system.

5. The lithographic apparatus as claimed in claim 1, comprising the component and wherein the component comprises a thermal conditioning system configured to reduce variations of temperature of at least the final element of the projection system;
   wherein a part of the thermal conditioning system surrounds a part of the fluid confinement structure such that a gap is provided between a surface of the thermal conditioning system and a surface of the fluid confinement structure that face each other; and
   wherein the one or more openings configured to extract gas are provided on one of the facing surfaces of the thermal conditioning system and the fluid confinement structure.

6. The lithographic apparatus as claimed in claim 1, wherein the one or more openings comprise a plurality of openings provided along a line that at least partially surrounds the space; and
   the cross section of the openings and/or a separation between adjacent openings, is different for a first group of the openings than for a second group of the openings.

7. The lithographic apparatus as claimed in claim 1, wherein at least one opening is associated with a gas flow restriction.

8. The lithographic apparatus as claimed in claim 1, wherein the one or more openings configured to be connectable to the other of the source of humidified gas and the under-pressure source to extract gas are in a surface of the projection system and/or of the component of the lithographic apparatus.

9. The lithographic apparatus as claimed in claim 1, wherein the one or more openings configured to be connectable to the other of the source of humidified gas and the under-pressure source to extract gas are in a surface of the liquid confinement structure.

10. A lithographic apparatus, comprising:
    a projection system configured to project a patterned radiation beam onto a substrate;
    a fluid confinement structure configured to confine immersion fluid in a localized region between a final element of the projection system and a surface of the substrate;
    a space bounded on one side by a surface of the projection system and/or a component of the lithographic apparatus at least partially surrounding the final element of the projection system, and on the other side by a surface of the fluid confinement structure;
    a flexible seal extending between the fluid confinement structure and one of the surfaces of the projection system and/or the component of the lithographic apparatus, the flexible seal configured such that the space is further bounded by the flexible seal; and
    one or more openings in the surface of the projection system and/or of the component of the lithographic apparatus, configured to be connectable to either a source of humidified gas to supply humidified gas to the space or an under-pressure source to extract gas from the space.

11. The lithographic apparatus as claimed in claim 10, wherein the flexible seal is configured to reduce flow of gas past the flexible seal when the volume of the space is constant but to permit gas flow past the seal when the volume of the space changes.

12. The lithographic apparatus as claimed in claim 10, wherein the flexible seal is connected at a first edge of the flexible seal to a surface of the fluid confinement structure or the surface of the projection system and/or the component of the lithographic apparatus and configured such that a second edge of the flexible seal abuts the other of the surface of the fluid confinement structure or the surface the projection system and/or the component of the lithographic apparatus.

13. A method of manufacturing a device using a lithographic apparatus, the method comprising:
   using a projection system to project a patterned radiation beam onto a substrate through an immersion fluid;
   using a fluid confinement structure to supply and confine the immersion fluid in a localized region between a final element of the projection system and the substrate;
   providing a space bounded on one side by a surface of the projection system and/or of a component of the lithographic apparatus at least partially surrounding the final element of the projection system, the component separated from the fluid confinement structure, and on the other side by a surface of the fluid confinement structure; and
   either supplying humidified gas to or extracting gas from, one or more openings in the surface of the projection system and/or of the component of the lithographic apparatus; and
   using one or more openings to do the other of supply humidified gas or extract gas from the space, wherein the one or more openings configured supply humidified gas to the space are closer to the immersion fluid in the localized region than the one or more openings configured to extract gas from the space.

14. The method as claimed in claim 13, wherein the one or more openings in the surface are provided in the surface of the projection system.

15. The method as claimed in claim 13, wherein the space is bounded by the surface of the component and wherein the component comprises a thermal conditioning system configured to reduce variations of temperature of at least the final element of the projection system; and
   wherein the one or more openings in the surface are formed in a surface of the thermal conditioning system.

16. The method as claimed in claim 13, wherein the space is bounded by the surface of the component and wherein the component comprises a thermal conditioning system configured to reduce variations of temperature of at least the final element of the projection system;
   wherein a part of the thermal conditioning system surrounds a part of the fluid confinement structure such that a gap is provided between a surface of the thermal conditioning system and a surface of the fluid confinement structure that face each other; and
   wherein the one or more openings configured to extract gas are provided on one of the facing surfaces of the thermal conditioning system and the fluid confinement structure.

17. The method as claimed in claim 13, wherein the one or more openings comprise a plurality of openings provided along a line that at least partially surrounds the space; and
   wherein the cross section of the openings and/or a separation between adjacent openings, is different for a first group of the openings than for a second group of the openings.

18. The method as claimed in claim 13, wherein the one or more openings in the surface are formed in a gas supply conduit that is mounted to the projection system by a vibration isolation system.

19. A method of manufacturing a device using a lithographic apparatus, the method comprising:
   using a projection system to project a patterned radiation beam onto a substrate through an immersion fluid;
   using a fluid confinement structure to supply and confine the immersion fluid in a localized region between a final element of the projection system and the substrate;
   providing a space bounded on one side by a surface of the projection system and/or a component of the lithographic apparatus at least partially surrounding the final element of the projection system, and on the other side by a surface of the fluid confinement structure, wherein the space is further bounded by a flexible seal extending between the fluid confinement structure and one of the surfaces of the at least one of the projection system and/or the component of the lithographic apparatus; and
   (i) supplying humidified gas to one or more openings on the surface of the projection system and/or the component of the lithographic apparatus bounding the space, and/or (ii) extracting gas from one or more openings in the surface of the projection system and/or the component of the lithographic apparatus bounding the space.

20. The method as claimed in claim 19, wherein the flexible seal is configured to reduce flow of gas past the flexible seal when the volume of the space is constant but to permit gas flow past the seal when the volume of the space changes.

* * * * *